United States Patent
Zhang et al.

(10) Patent No.: US 11,104,110 B2
(45) Date of Patent: Aug. 31, 2021

(54) LAMINATING DEVICES AND LAMINATING METHODS FOR CURVED COVER PLATES WITH IRREGULAR SHAPE AND FLEXIBLE SCREEN

(71) Applicant: Yungu (Gu' an) Technology Co., Ltd., Langfang (CN)

(72) Inventors: Wei Zhang, Langfang (CN); Bing Han, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 235 days.

(21) Appl. No.: 16/454,082

(22) Filed: Jun. 27, 2019

(65) Prior Publication Data

US 2019/0315109 A1    Oct. 17, 2019

Related U.S. Application Data

(63) Continuation of application No. PCT/CN2018/111497, filed on Oct. 23, 2018.

(30) Foreign Application Priority Data

Apr. 20, 2018    (CN) .......................... 201810359604.3

(51) Int. Cl.
*B32B 37/00* (2006.01)
*G06F 1/16* (2006.01)
(Continued)

(52) U.S. Cl.
CPC ........ *B32B 37/0053* (2013.01); *G06F 1/1652* (2013.01); *B32B 3/28* (2013.01);
(Continued)

(58) Field of Classification Search
USPC .......................................... 156/555
See application file for complete search history.

(56) References Cited

U.S. PATENT DOCUMENTS

| 9,884,474 B2 * | 2/2018 | Ok ........................ G02F 1/1303 |
| 2016/0279915 A1 * | 9/2016 | Uemura .............. B32B 38/1858 |

(Continued)

FOREIGN PATENT DOCUMENTS

| CN | 104471630 A | 3/2015 |
| CN | 106920830 A | 7/2017 |

(Continued)

OTHER PUBLICATIONS

CN First Office Action dated Jun. 17, 2019 in the corresponding CN application (application No. 201810359604.3).

*Primary Examiner* — James D Sells
(74) *Attorney, Agent, or Firm* — Kilpatrick Townsend & Stockton LLP

(57) ABSTRACT

A laminating device for attaching a curved cover plate with an irregular shape to a flexible screen includes a pressing flat body, two laminating sheets and two laminating sheet rolling wheels. The pressing flat body having a pressing flat wall to carry the flexible screen, to attached the flexible screen to a portion of the flat area of the curved cover plate with the irregular shape. The two laminating sheets are arranged on opposite sides of the pressing flat body. A first end of each of the laminating sheets is attached to the pressing flat body, and a second end of each of the laminating sheets opposite to the first end is curlable towards the pressing flat body. The two laminating sheet rolling wheels are corresponding to the two laminating sheets. Each of the laminating sheet rolling wheels moves on the curved cover plate with the irregular shape, respectively.

19 Claims, 4 Drawing Sheets

(51) Int. Cl.
  *B32B 3/28*    (2006.01)
  *B32B 17/06*   (2006.01)
  *H05K 5/02*    (2006.01)
  *B32B 37/10*   (2006.01)

(52) U.S. Cl.
  CPC ........... *B32B 17/06* (2013.01); *B32B 37/1009* (2013.01); *B32B 2250/03* (2013.01); *B32B 2457/20* (2013.01); *G02F 2202/28* (2013.01); *H01L 2251/5338* (2013.01); *H05K 5/02* (2013.01)

(56) References Cited

U.S. PATENT DOCUMENTS

| | | |
|---|---|---|
| 2017/0072671 A1 | 3/2017 | Son et al. |
| 2018/0093464 A1 | 4/2018 | Lee et al. |
| 2018/0301643 A1 | 10/2018 | Xu et al. |
| 2019/0051847 A1 | 2/2019 | Wang |

FOREIGN PATENT DOCUMENTS

| | | |
|---|---|---|
| CN | 107039604 A | 8/2017 |
| CN | 107203297 A | 9/2017 |
| CN | 107688403 A | 2/2018 |
| CN | 107914451 A | 4/2018 |
| CN | 108597373 A | 9/2018 |
| WO | 2014021192 A1 | 2/2014 |

\* cited by examiner

LAMINATING DEVICES AND LAMINATING METHODS FOR CURVED COVER PLATES WITH IRREGULAR SHAPE AND FLEXIBLE SCREEN

CROSS REFERENCE TO RELATED APPLICATIONS

The present application is a continuation application of International Application No. PCT/CN2018/111497, filed Oct. 23, 2018, and claims the priority to Chinese application No. 2018103596043 filed Apr. 20, 2018, and both of which are incorporated herein by reference in their entireties.

BACKGROUND

The flexible screen is a new growth point of the future industry, and the characteristic of flexibility of the flexible screen are continuously exploited and utilized. For example, by attaching the flexible screen to a 3D fixed curved cover plate (both sides of the cover plate are a quarter of arc), the display of the front and sides of the product can be realized.

A laminating method of the flexible screen is pressing the flexible onto the inner side of a glass cover plate via a silicon pad.

SUMMARY

Accordingly, it is necessary to provide a new laminating device.

A laminating device for attaching a curved cover plate with an irregular shape to a flexible screen is provided. The curved cover plate with an irregular shape includes a flat area and arc hook areas located on opposite sides of the flat area, and the arc hook areas smoothly extends to the flat area. The laminating device includes: a pressing flat body having a pressing flat wall capable of carrying the flexible screen, to attach the flexible screen to a portion of the flat area of the curved cover plate with the irregular shape; two laminating sheets arranged on opposite sides of the pressing flat body. A first end of each of the laminating sheet is attached to the pressing flat body, and a second end of each of the laminating sheets opposite to the first end is curlable towards the pressing flat body. Two laminating sheet rolling wheels corresponding to the two laminating sheets are provided. Each of the laminating sheet rolling wheels is movable on the curved cover plate with an irregular shape, respectively, to gradually unfold the corresponding laminating sheets gradually unfold, for pressing the flexible screen carried by the pressing flat body onto the curved cover plate with an irregular shape.

In one of the embodiments, each of the laminating sheet rolling wheels moves on the curved cover plate with the irregular shape, respectively, to gradually unfold the corresponding laminating sheets includes: each of the laminating sheet rolling wheels to move on a surface of the flat area and an inner surface of the corresponding arc hook area of the curved cover plate with the irregular shape along a predetermined moving path, respectively, and the two laminating sheets gradually unfold to both sides on the surface of the flat area and the inner surfaces of the arc hook areas via pressing the corresponding laminating sheets.

In one of the embodiments, the laminating device for attaching the curved cover plate with the irregular shape to the flexible screen further includes two elastic elements. One end of each of the elastic elements is attached to the pressing flat body, and the other end is attached to an end of the flexible screen.

In one of the embodiments, when the laminating sheets are unfolded, a surface formed by the laminating sheets and the pressing flat wall used to be in contact with the flexible screen smoothly transit on junctions therebetween, the two laminating sheets are symmetrically arranged on the opposite sides of the pressing flat body.

In one of the embodiments, the laminating device for attaching the curved cover plate with the irregular shape to the flexible screen further includes a laminating sheet rolling wheel rail defining the predetermined moving path. The laminating sheet rolling wheels are supported by the laminating sheet rolling wheel rail, and are movable along the laminating sheet rolling wheel rail driven by a power mechanism.

In one of the embodiments, ratios of diameters of the laminating sheet rolling wheels and outer diameters of the laminating sheets in a curved state range from ¼ to ½.

In one of the embodiments, a length of the pressing flat wall is greater than or equal to a length of the flexible screen along a direction defined by an axial direction of the laminating sheet rolling wheels.

In one of the embodiments, the laminating sheets are elastic material sheets having a curved shape memory function.

In one of the embodiments, the pressing flat wall has a plurality of vacuum adsorption holes.

In one of the embodiments, the laminating device for attaching the curved cover plate with the irregular shape to the flexible screen further includes a negative pressure system to provide negative pressure to the vacuum adsorption holes.

In one of the embodiments, the elastic elements are elastic tapes.

In one of the embodiments, the elastic elements are adhered to the ends of the flexible screen.

In one of the embodiments, ends of the pressing flat body are provided with a moving channel used to receive the corresponding laminating sheet rolling wheels and allow the laminating sheet rolling wheels to move towards both sides and to be removed from the pressing flat body.

The present disclosure also provides a method for attaching a curved cover plate with an irregular shape to a flexible screen by using a laminating device. The laminating device includes a pressing flat body having a pressing flat wall, two laminating sheets, and two laminating sheet rolling wheels, and the curved cover plate with the irregular shape comprises a flat area. The method includes:

attaching a center portion of the flexible screen onto the pressing flat wall of the pressing flat body, thus obtaining an initial body;

embedding the initial body into an interior of the curved cover plate with the irregular shape, to bond at least part of the flat area of the curved cover plate with the irregular shape is bonded to the flexible screen; and controlling each of the laminating sheet rolling wheels to move on the curved cover plate with the irregular shape, respectively, to gradually unfold the corresponding laminating sheets, thereby pressing the flexible screen carried by the pressing flat body onto the curved cover plate with the irregular shape and completely laminating the flexible screen to the curved cover plate with the irregular shape.

In one of the embodiments, the step of controlling each of the laminating sheet rolling wheels to move on the curved cover plate with the irregular shape, respectively, to gradually unfold the corresponding laminating sheets includes: moving each of the laminating sheet rolling wheels on a surface of the flat area and an inner surface of the corresponding arc hook area of the curved cover plate with the irregular shape along a predetermined moving path, respectively, to gradually unfold the two laminating sheets to both sides on the surface of the flat area and the inner surfaces of the arc hook areas via pressing the corresponding laminating sheets.

In one of the embodiments, after attaching the center portion of the flexible screen onto the pressing flat wall of the pressing flat body, and prior to obtaining the initial body, the method further includes attaching both ends of the flexible screen to an elastic element being connected to the pressing flat body, respectively.

In one of the embodiments, the flexible screen is curved in advance before attaching the center portion of the flexible screen onto the pressing flat wall of the pressing flat body.

In one of the embodiments, the flexible screen is attached with a laminating adhesive layer for adhering the curved cover plate with the irregular shape and the flexible screen together before attaching the center portion of the flexible screen onto the pressing flat wall of the pressing flat body.

In one of the embodiments, an interior surface of the flexible screen is attached with a laminating adhesive layer for adhering the curved cover plate with the irregular shape and the flexible screen together before inserting the initial body into the interior of the curved cover plate with the irregular shape.

In one of the embodiments, the pressing flat wall has a plurality of vacuum adsorption holes. The step of attaching the center portion of the flexible screen onto the pressing flat wall of the pressing flat body includes: adsorbing the center portion of the flexible screen onto the pressing flat wall by means of vacuum absorption, then attaching the flexible screen onto the pressing flat wall by means of pressing.

According to the aforementioned laminating method, the flexible screen is prevented from contacting with the edges of the curved cover plate with the irregular shape, so as to realize the attaching of the flexible screen to the arc hook areas of the curved cover plate with the irregular shape. Moreover, according to the aforementioned laminating method, the different areas of the flexible screen is bonded in different steps, thereby sufficiently attaching the arc hook areas of the curved cover plate with the irregular shape and further improving the laminating effect.

Applied with the laminating device according to the present disclosure, the flexible screen and the curved cover plate with the irregular shape can be completely bonded. Moreover, by the method that one end of the elastic element is connected to the pressing flat body and another end is connected to the end of the flexible screen, the flexible screen is prevented from contacting with the edges of the curved cover plate with the irregular shape, so as to realize the attaching of the flexible screen to the arc hook areas of the curved cover plate with the irregular shape. Moreover, according to the aforementioned laminating device, the different areas of the flexible screen is bonded in different steps, thereby sufficiently attaching the arc hook areas of the curved cover plate with the irregular shape and further improving the laminating effect.

DETAILED DESCRIPTION OF THE EMBODIMENTS

As explained above, lamination of flexible screens is a desirable process. A laminating device can only bond the 3D fixed curved cover plate, when the cover plate is designed to be bent inward, that is, when the cover plate has an irregular shape, the lamination cannot be realized by the conventional laminating device.

Embodiments of the present disclosure are described more fully hereinafter with reference to the accompanying drawings, in which some embodiments of the present disclosure are shown. The various embodiments of the present disclosure may, however, be embodied in many different forms and should not be construed as limited to the embodiments set forth herein.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "left", "right" and the like are merely for the illustrative purpose.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

Figure 1:
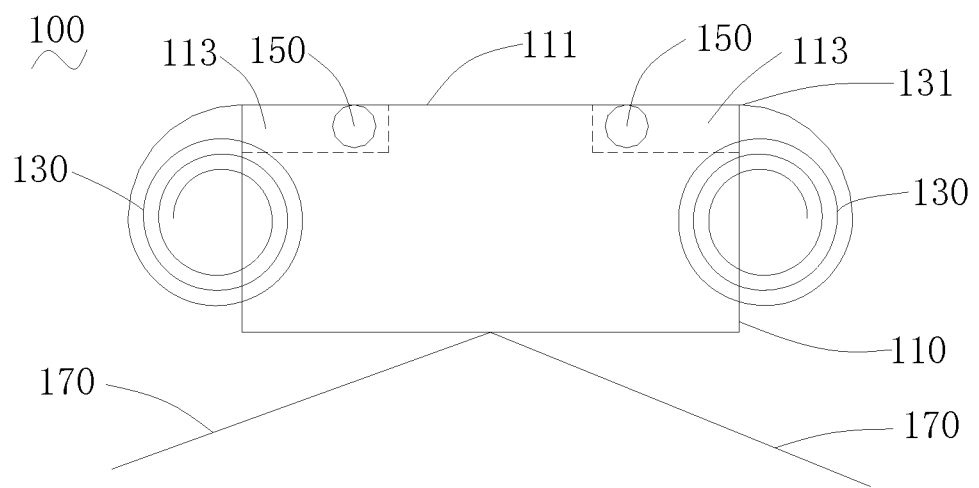
FIG. 1 is a schematic view of a laminating device for a curved cover plate with an irregular shape and a flexible screen according to an embodiment of the present disclosure.
Figure 2:
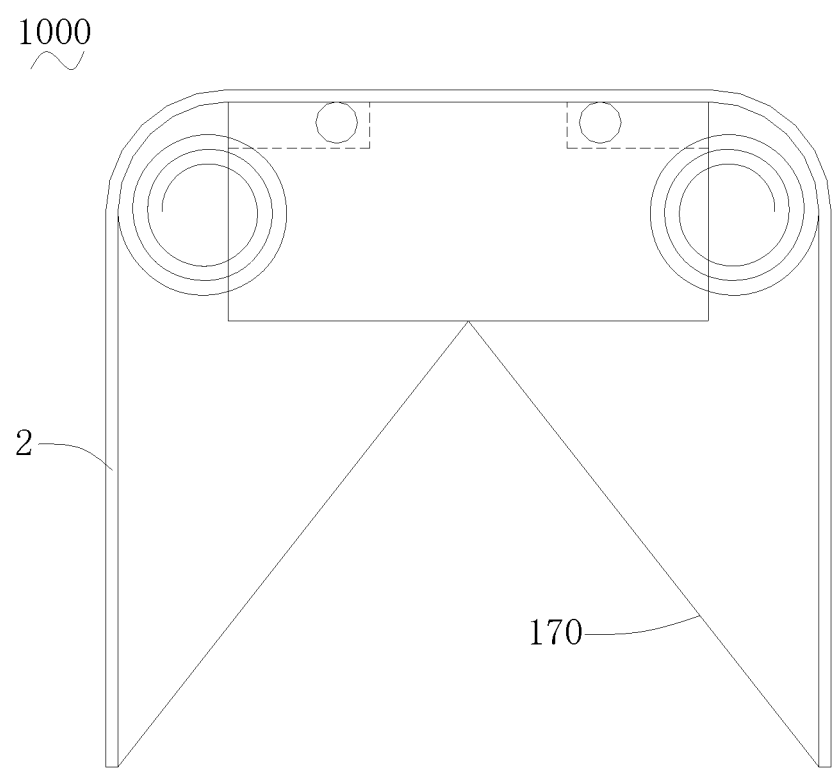
FIG. 2 is a schematic view of an initial body formed by attaching a flexible screen to the laminating device of FIG. 1.
Figure 3:
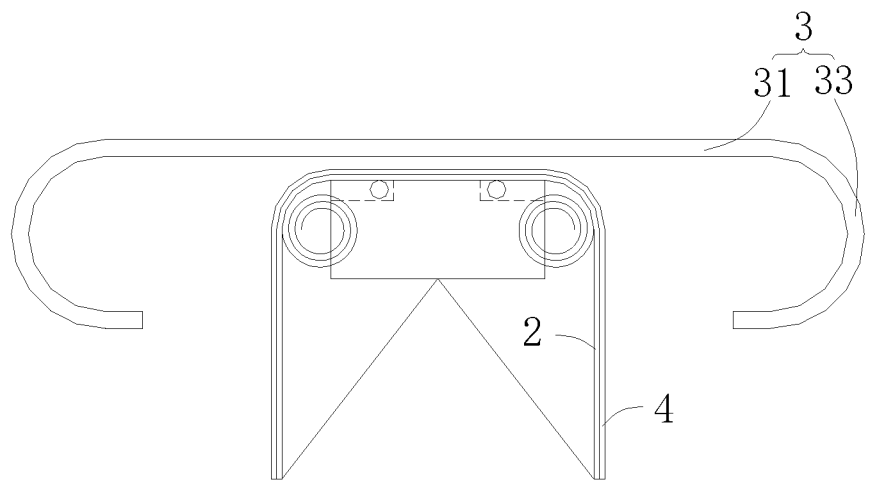
FIG. 3 is a schematic view of the initial body of FIG. 2 inserting into the interior of the curved cover plate with the irregular shape.
Figure 4:
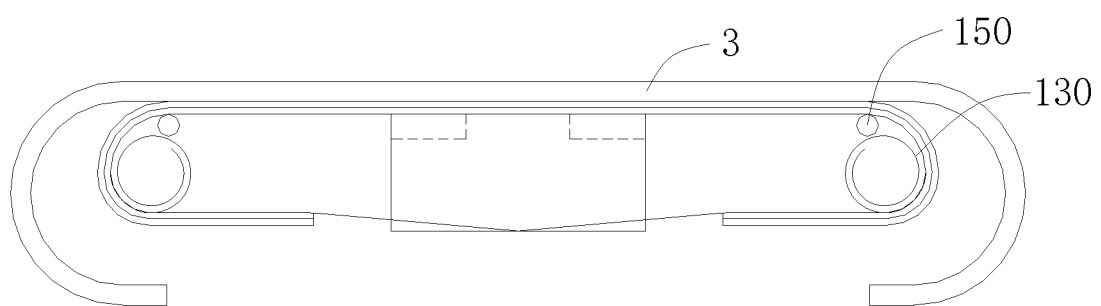
FIG. 4 is a schematic view of the laminating sheet rolling wheels moves certain distances to both sides of the flat area.
Figure 5:
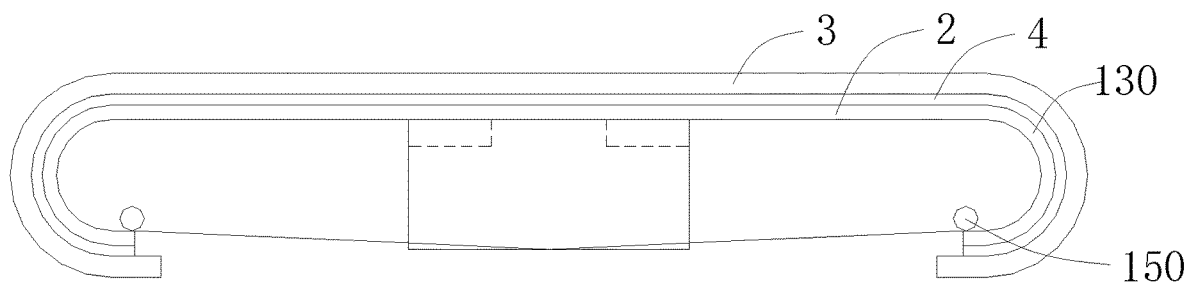
FIG. 5 is a schematic view of completing laminating of the flexible screen and the curved cover plate with the irregular shape.

As shown in FIG. 1 to FIG. 5, a laminating device 100 according to an embodiment for attaching a curved cover plate with an irregular shape to a flexible screen is used to attach the flexible screen 2 to an inner surface of the cover plate 3 with the irregular shape. The cover plate 3 with the irregular shape includes a flat area 31 with a planar shape, and arc hook areas 33 located on opposite sides of the flat area 31, and the arc hook areas 33 smoothly transit to the flat area 31. In other words, the flat area 31 is located in a center position, and two arc hook areas 33 formed by bending opposite sides of the flat area 31 inwardly, respectively. Preferably, in the illustrated embodiment, the arc hook areas 33 has a shape of semi-circular that is tangential to the flat area 31. It should be noted that, in the illustrated embodiment, the opposite sides of the flat area 31 are virtual edges, which are also virtual boundaries between the flat area 31 and the arc hook areas 33.

The laminating device 100 for the curved cover plate 3 with the irregular shape and the flexible screen 2 includes: a pressing flat body 110, two laminating sheets 130, and two laminating sheet rolling wheels 150 located in the interior of the laminating sheets 130, respectively. Additionally, in a preferred solution, the laminating device 100 can further include two elastic elements 170, as shown in the figures.

The pressing flat body 110 includes a pressing flat wall 111 structurally matching with the partial flat area of the curved cover plate 3 with the irregular shape. The pressing flat wall 111 is adapted to support the flexible screen, and is used to attach the partial flat area 31 of the curved cover plate 3 with the irregular shape to the flexible screen 2. The length of the pressing flat wall 111 along the axial direction of the laminating sheet rolling wheel 150 is greater than or equal to the lengths of the flexible screen 2 and the curved cover plate 3 with the irregular shape along the axial direction of the laminating sheet rolling wheel.

The two laminating sheets 130 are arranged on opposite sides of the pressing flat body 110. Preferably, the two laminating sheets 130 have substantially the same structures, and are symmetrically arranged on opposite sides of the pressing flat body 110. A first end of each of the laminating sheets 130 is a fixing end 131 connected to the pressing flat body 110, and a second end of each of the laminating sheets 130 opposite to the fixing end 131 can be curled inward (in the direction towards the pressing flat body 110). It should be noted that, the laminating sheets 130 can also be unfolded away from the pressing flat body 110 by an external force. When the laminating sheets 130 are unfolded, a surface formed by the laminating sheets 130 and the pressing flat wall 111 for contacting with the flexible screen 2 smoothly transits on a junction therebetween, thereby ensuring the flexible screen 2 is continuously attached to the interior of the curved cover plate 3 with the irregular shape.

Preferably, the laminating sheets 130 can be elastic material sheets having a curved shape memory function, such as rubber sheets or the like. The elastic material has have a certain flexibility, so as to effectively avoid scratching the flexible screen 2. The laminating sheets 130 can also be film-type laminating sheets wound around the laminating sheet rolling wheels 150 (or referred as a laminating sheet roller), and the unfolding and curving of the laminating sheets are realized as the laminating sheet rolling wheels 150 rotate and move. Of course, the structure of the laminating sheet 130 is not limited hereto, as long as the structure can be applied to the laminating device of the present disclosure without scratching the flexible screen.

The two laminating sheet rolling wheels 150 are located between the two laminating sheets 130, and are corresponding to the two laminating sheets 130, respectively. Each of the laminating sheet rolling wheels 150 moves on the surface of the flat area and the inner surface of the corresponding arc hook area 33 of the curved cover plate 3 with the irregular shape along a predetermined moving path, respectively, and the two laminating sheets 130 gradually unfold to both sides on the surface of the flat area and the inner surfaces of the arc hook areas 33 via pressing the corresponding laminating sheets 130, so as to press the flexible screen 2 carried by the pressing flat body 110 onto the curved cover plate 3 with the irregular shape. It should be noted that, the laminating sheet rolling wheels 150 press the surfaces of the laminating sheets 130 facing away from flexible screen 2.

Preferably, the predetermined moving path of the laminating sheet rolling wheel 150 can be defined by a separately provided laminating sheet rolling wheel rail (not shown). The laminating sheet rolling wheels 150 are supported by the laminating sheet rolling wheel rail, and the laminating sheet rolling wheels 150 are movable along the laminating sheet rolling wheel rail via driving of a power mechanism (not shown). For example, the power mechanism can be an electric motor, so as to better control the movement direction, the movement speed, the movement time, and the like of the laminating sheet rolling wheels 150, thereby better completing the laminating of the flexible screen 2 and the curved cover plate 3 with the irregular shape. The length of the laminating sheet rolling wheel 150 along the axial direction thereof is for example adapted to the length of the laminating sheet 130 along the axial direction of the laminating sheet rolling wheel 150. Also, the two lengths are both larger than or equal to the lengths of the flexible screen 2 and the curved cover plate 3 with the irregular shape along the axial direction of the laminating sheet rolling wheel 150, such that the flexible screen 2 and the curved cover plate 3 with the irregular shape can be better attached.

It should be noted that, if the laminating sheets 130 are elastic material sheets having a curved shape memory function, when the laminating sheet rolling wheels 150 are not pressing the laminating sheet 130, the laminating sheets 130 can automatically return to the curved shape. When the laminating sheet rolling wheels 150 are film-type laminating sheets wound around the laminating sheet rolling wheels 150 (or referred as a laminating sheet roller), the laminating sheets can return to the curled shapes wound around the laminating sheet rolling wheels 150 by driving the laminating sheet rolling wheels 150 to rotate and move reversely.

In order to prevent interference with the natural curling of each laminating sheet 130 when not being pressed by the laminating sheet rolling wheels 150, preferably, the pressing flat body 110 is provided with an escaping space for receiving the laminating sheet rolling wheels 150. Specifically, in the illustrated embodiment, both end of the pressing flat body 110 is provided with a moving channel 113 for receiving the corresponding laminating sheet rolling wheel 150 and for moving the laminating sheet rolling wheel 150 to both sides and moving out of the pressing flat body 110, and the moving channel 113 is the escaping space. Of course, if the pressing flat body 110 only has the pressing flat wall 111, the laminating sheet rolling wheels 150 can be located on the side surface of the pressing flat wall 111 away from the curved cover plate 3 with the irregular shape, and is spaced away from the laminating sheet 130 at a certain distance. Alternatively, when the pressing flat body 110 is implemented as a frame structure and the length of the pressing flat body 110 along the axial direction of the laminating sheet rolling wheels 150 is greater than the length of the laminating sheet rolling wheels 150 along the axial direction thereof, the laminating sheet rolling wheels 150 can be directly located on the side surface of the pressing flat wall 111 away from the curved cover plate 3 with the irregular shape, and is spaced away from the corresponding laminating sheet 130 at a certain distance.

One end of each of the elastic elements 170 is connected to the pressing flat body 110, and the other end is connected to different end of the flexible screen 2. That is, each end of the flexible screen 2 is provided with an elastic element 170 between the end and the pressing flat body 110. By providing the elastic elements, the flexible screen 2 can be prevented from contacting other adjacent objects caused by uncontrolled edges of the flexible screen 2 during the boding of the flexible screen 2 and the curved cover plate 3 with the irregular shape.

Preferably, a ratio of the diameter of each of the laminating sheet rolling wheels 150 and the outer diameter of each of the laminating sheets 130 in a curled state ranges from ¼ to ½, therefore the two laminating sheets 130 can be gradually unfolded to both sides, respectively. It should be noted that, the outer diameter of each of the laminating sheets 150 in the curled state herein includes any outer diameters in any states as long as the sheet is curled. That is, during unfolding outwards the laminating sheets 130, as long as the laminating sheets 130 is in a curled state, the ratio of the diameter of each of the laminating sheet rolling wheels 150 and the outer diameter of each of the curved portion of the laminating sheets 130 still falls into the aforementioned range.

In the illustrated embodiment, the pressing flat wall 111 is provided with a plurality of vacuum adsorption holes (not shown). Additionally, the laminating device 100 further includes a negative pressure system to provide negative pressure to the vacuum adsorption holes. Therefore, the flexible screen can be attached onto the pressing flat body 110 via vacuum adsorption, thereby improving the laminating effect between the flexible screen 2 on the corresponding area of the pressing flat wall 111 and the flat area 31 of the curved cover plate 3 with the irregular shape.

In the illustrated embodiment, the elastic elements 170 are preferably elastic tapes. One end of each of the elastic tapes is directly adhered and connected to the pressing flat body 110, and the other end is connected to one of the ends of the flexible screen 2, so as to facilitate the operation.

In other embodiments, the elastic elements 170 can be fixedly connected to the flexible screen 2 by the double-sided tape. On the one hand, adhering by the double-sided tape is not harmful to the flexible screen 2. On the other hand, after the laminating of the flexible screen 2 and the curved cover plate 3 with the irregular shape is completed, the double-sided tape can be easily removed from the flexible screen 2. Additionally, even if the double-sided tape is not completely removed from the flexible screen 2, the remaining double-sided tape will not affect the display of the flexible screen 2.

In the laminating device according to the present disclosure, by controlling the moving paths of the laminating sheet rolling wheels 150, the laminating sheet rolling wheels 150 can move on inner surfaces of the arc hook areas with various sizes, thereby unfolding and pressing the laminating sheets 130, such that the flexible screen 2 located between the laminating sheets and the curved cover plate 3 with the irregular shape is sufficiently attached to the curved cover plate 3 with the irregular shape, and the attachment between the flexible screen 2 and the hook arc area 33 of the curved cover plate 3 with the irregular shape is realized. Additionally, with the aforementioned laminating device 100, different areas of the flexible screen 2 are attached in different steps, thereby sufficiently laminating the arc hook areas 33 of the curved cover plate 3 with the irregular shape and further improving the laminating effect.

The present disclosure also provides a method for laminating a curved cover plate with an irregular shape and a flexible screen by using a laminating device for the curved cover plate with the irregular shape and the flexible screen. The laminating device 100 can be referred to the above. The laminating device 100 includes a pressing flat body 110 having a pressing flat wall 111, two laminating sheets 130, and two laminating sheet rolling wheels 150, the curved cover plate 3 with the irregular shape includes a flat area 31. The method includes:

Step S1, a center portion of the flexible 2 screen is attached onto the pressing flat wall 111 of the pressing flat body 110, and thus an initial body is obtained.

Step S2, the initial body is embedded into an interior of the curved cover plate 3 with the irregular shape, such that at least part of the flat area 31 of the curved cover plate 3 with the irregular shape is attached to the flexible screen 2.

Step S3, each of the laminating sheet rolling wheels 150 is controlled to move on the curved cover plate 3 with the irregular shape, respectively, and the corresponding laminating sheets 130 are gradually unfolded, for pressing the flexible screen 2 carried by the pressing flat body 110 onto the curved cover plate 3 with the irregular shape and completely laminating the flexible screen 2 to the curved cover plate 3 with the irregular shape.

Preferably, the step of controlling each of the laminating sheet rolling wheels 150 to move on the curved cover plate 3 with the irregular shape, respectively, to gradually unfold the corresponding laminating sheets 130 includes: each of the laminating sheet rolling wheels 150 is moved on a surface of the flat area 31 and an inner surface of the corresponding arc hook area 33 of the curved cover plate 3 with the irregular shape along a predetermined moving path, respectively, and the two laminating sheets 130 gradually unfold to both sides on the surface of the flat area 31 and the inner surfaces of the arc hook areas 33 via pressing the corresponding laminating sheets 130.

The flexible screen 2 is preferably a flexible OLED screen. Of course, it should be noted that, the flexible screen 2 can be other flexible screens.

Additionally, in step S1, after the attaching the center portion of the flexible screen 2 onto the pressing flat wall 111 of the pressing flat body 110, and before the obtaining the initial body, both ends of the flexible screen 2 can be connected to an elastic element 170, respectively, and each of the elastic elements 170 is connected to the pressing flat body 110, respectively.

Additionally, prior to step S1, that is, before attaching the center portion of the flexible screen 2 onto the pressing flat wall 111 of the pressing flat body 110, the flexible screen 2 can be attached to a laminating adhesive layer 4 used to adhere the curved cover plate 3 with the irregular shape and the flexible screen 2 together. The laminating adhesive layer 4 is preferably an OCA layer. The laminating adhesive layer 4 can also be selected from other suitable adhesives. It should be noted that, prior to step S2, the release film of the laminating adhesive layer 4 should be removed.

The laminating adhesive layer 4 is used to adhere the curved cover plate 3 with the irregular shape and the flexible screen 2 by adhering, therefore the laminating adhesive layer 4 can be attached to the interior surface of the curved cover plate 3 with the irregular shape in advance, and in this case, no laminating adhesive layer is required to be attached to the flexible screen in advance. The step of attaching the laminating adhesive layer 4 to the curved cover plate 3 with the irregular shape in advance is acceptable as long as it occurs before the step of inserting the initial body 1000 into the interior of the curved cover plate 3 with the irregular shape.

Additionally, before attaching the center portion of the flexible screen 2 to the pressing flat body 110, preferably, the flexible screen 2 is curled in advance, and then the center portion of the curved flexible screen 2 is attached onto the pressing flat wall of the pressing flay body 110.

The laminating of the flexible screen 2 attached to the pressing flat wall 111 and the flat area 31 of the curved cover plate 3 with the irregular shape can be realized by pressing the pressing flay body 110. Of course, the laminating of the flexible screen 2 attached to the pressing flat wall 111 and the flat area 31 of the curved cover plate 3 with the irregular shape can also be realized by moving the curved cover plate 3 with the irregular shape.

Additionally, in step S1, the method of attaching the flexible screen 2 to the pressing flat body 110 is for example by vacuum adsorption. Specifically, the pressing flat wall 111 is provided with a plurality of vacuum adsorption holes, and the center portion of the flexible screen 2 is adsorbed onto the pressing flat wall 111 of the pressing flat body 110 by vacuum adsorption, then the flexible screen 2 is attached onto the pressing flat wall 111 of the pressing flat body 110 by pressing. Preferably, the adsorption pressure for vacuum adsorption is −60 kpa to −80 kpa, more preferably −80 kpa.

Additionally, in order to prevent the failure of laminating caused by the moving of the curved cover plate 3 with the irregular shape, the curved cover plate 3 with the irregular shape can be fixed prior to step 2, or the curved cover plate 3 with the irregular shape can be fixed to a motion controllable device. Preferably, the curved cover plate 3 with the irregular shape can be fixed to a platform having a fixing groove. More preferably, the platform is made of a silicone material, and the stress acting on the curved cover plate 3 with the irregular shape and the flexible screen 2 can be effectively relieved.

Preferably, in step S2, before the step of laminating the flat area 31 of the curved cover plate 3 with the irregular shape and the flexible screen 2, the region between the flexible screen 2 and the curved cover plate 3 with the irregular shape is evacuated, or step S2 is operated in a vacuum environment, so as to better prevent the occurrence of bubbles in the flexible screen 2 and the curved cover plate 3 with the irregular shape in this region during the laminating process.

According to the aforementioned laminating method, the flexible screen 2 is prevented from contacting with the edges of the curved cover plate 3 with the irregular shape, so as to realize the attaching of the flexible screen 2 to the arc hook areas 33 of the curved cover plate 3 with the irregular shape. Moreover, according to the aforementioned laminating method, the different areas of the flexible screen 2 is attached in different steps, thereby sufficiently attaching the arc hook areas 33 of the curved cover plate 3 with the irregular shape and further improving the laminating effect.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

The invention claimed is:

1. A laminating device, for attaching a curved cover plate with an irregular shape to a flexible screen, wherein the curved cover plate with an irregular shape comprises a flat area and arc hook areas located on opposite sides of the flat area, and the arc hook areas smoothly extending to the flat area;

the laminating device comprising:

a pressing flat body having a pressing flat wall capable of carrying the flexible screen, to attach the flexible screen to a portion of the flat area of the curved cover plate with an irregular shape;

two laminating sheets arranged on opposite sides of the pressing flat body, a first end of each of the laminating sheets being attached to the pressing flat body, and a second end of each of the laminating sheets opposite to the first end being curlable towards the pressing flat body;

two laminating sheet rolling wheels corresponding to the two laminating sheets and located between the two laminating sheets, each of the laminating sheet rolling wheels being movable on the curved cover plate with an irregular shape, to gradually unfold the corresponding laminating sheets, for pressing the flexible screen carried by the pressing flat body onto the curved cover plate with an irregular shape; and two elastic elements, one end of each of the elastic elements being attached to the pressing flat body, and the other end being attached to an end of the flexible screen.

2. The laminating device according to claim 1, wherein each of the laminating sheet rolling wheels moves on the curved cover plate with an irregular shape, to gradually unfold the corresponding laminating sheets comprises: each of the laminating sheet rolling wheels moves on a surface of the flat area and an inner surface of the corresponding arc hook area of the curved cover plate with an irregular shape along a predetermined moving path, respectively, and the two laminating sheets gradually unfold both sides on the surface of the flat area and the inner surfaces of the arc hook areas via pressing the corresponding laminating sheets.

3. The laminating device according to claim 1, wherein when the laminating sheets are unfolded, a surface formed by the laminating sheets and the pressing flat wall attached to the flexible screen smoothly transit on junctions therebetween, the two laminating sheets are symmetrically arranged on the opposite sides of the pressing flat body.

4. The laminating device according to claim 2, further comprising a laminating sheet rolling wheel rail defining the predetermined moving path, the laminating sheet rolling wheels being supported by the laminating sheet rolling wheel rail, and being movable along the laminating sheet rolling wheel rail driven by a power mechanism.

5. The laminating device according to claim 1, wherein a ratio of a diameter of each of the laminating sheet rolling wheels and an outer diameter of each of the laminating sheets in a curled state ranges from ¼ to ½.

6. The laminating device according to claim 1, wherein a length of the pressing flat wall is greater than or equal to a length of the flexible screen along a direction defined by an axial direction of the laminating sheet rolling wheels.

7. The laminating device according to claim 1, wherein the laminating sheets are elastic material sheets having a curved shape memory function.

8. The laminating device according to claim 1, wherein the pressing flat wall has a plurality of vacuum adsorption holes.

9. The laminating device according to claim 8, further comprising a negative pressure system capable of providing negative pressure to the vacuum adsorption holes.

10. The laminating device according to claim 1, wherein the elastic elements are elastic tapes.

11. The laminating device according to claim 10, wherein the elastic elements are adhered to the ends of the flexible screen.

12. The laminating device according to claim 1, wherein ends of the pressing flat body are provided with moving channels capable of receiving the corresponding laminating sheet rolling wheels and allow the laminating sheet rolling wheels to move towards both sides and to be removed from the pressing flat body.

13. A method for attaching a curved cover plate with an irregular shape to a flexible screen by using a laminating device, wherein the laminating device comprises a pressing flat body having a pressing flat wall, two laminating sheets, and two laminating sheet rolling wheels, and the curved cover plate with an irregular shape comprises a flat area;

the method comprising:

attaching a center portion of the flexible screen onto the pressing flat wall of the pressing flat body, attaching both ends of the flexible screen to an elastic element being connected to the pressing flat body, thus obtaining an initial body;

embedding the initial body into an interior of the curved cover plate with an irregular shape, to attach at least part of the flat area of the curved cover plate with an irregular shape to the flexible screen; and controlling each of the laminating sheet rolling wheels to move on the curved cover plate with an irregular shape, respectively to gradually unfold the corresponding laminating sheets, for pressing the flexible screen carried by the pressing flat body onto the curved cover plate with an irregular shape and completely laminating the flexible screen to the curved cover plate with an irregular shape.

14. The method according to claim 13, wherein the step of controlling each of the laminating sheet rolling wheels to move on the curved cover plate with an irregular shape, respectively, to gradually unfold the corresponding laminating sheets comprises: moving each of the laminating sheet rolling wheels on a surface of the flat area and an inner surface of the corresponding arc hook area of the curved cover plate with an irregular shape along a predetermined moving path, respectively, to gradually unfold the two laminating sheets to both sides on the surface of the flat area and the inner surfaces of the arc hook areas via pressing the corresponding laminating sheets.

15. The method according to claim 13, wherein the flexible screen is curved in advance prior to attaching the center portion of the flexible screen onto the pressing flat wall of the pressing flat body.

16. The method according to claim 13, wherein the flexible screen is attached to a laminating adhesive layer configured to adhere the curved cover plate with an irregular shape to the flexible screen together prior to attaching the center portion of the flexible screen onto the pressing flat wall of the pressing flat body.

17. The method according to claim 13, wherein an interior surface of the flexible screen is attached with a laminating adhesive layer configured to adhere the curved cover plate with an irregular shape and the flexible screen together prior to inserting the initial body into the interior of the curved cover plate with an irregular shape.

18. The method according to claim 13, wherein the pressing flat wall is provided with a plurality of vacuum adsorption holes, the attaching the center portion of the flexible screen onto the pressing flat wall of the pressing flat body comprising: adsorbing the center portion of the flexible screen onto the pressing flat wall by means of vacuum absorption, then attaching the flexible screen onto the pressing flat wall by means of pressing.

19. A laminating device, for attaching a curved cover plate with an irregular shape to a flexible screen, wherein the curved cover plate with an irregular shape comprises a flat area and arc hook areas located on opposite sides of the flat area, and the arc hook areas smoothly extending to the flat area;

the laminating device comprising:

a pressing flat body having a pressing flat wall capable of carrying the flexible screen, to attach the flexible screen to a portion of the flat area of the curved cover plate with an irregular shape;

two laminating sheets arranged on opposite sides of the pressing flat body, a first end of each of the laminating sheets being attached to the pressing flat body, and a second end of each of the laminating sheets opposite to the first end being curlable towards the pressing flat body; and two laminating sheet rolling wheels corresponding to the two laminating sheets and located between the two laminating sheets, each of the laminating sheet rolling wheels being movable on the curved cover plate with an irregular shape, to gradually unfold the corresponding laminating sheets, for pressing the flexible screen carried by the pressing flat body onto the curved cover plate with an irregular shape; wherein ends of the pressing flat body are provided with moving channels capable of receiving the corresponding laminating sheet rolling wheels and allow the laminating sheet rolling wheels to move towards both sides and to be removed from the pressing flat body.

* * * * *